United States Patent [19]

Feinberg

[11] Patent Number: 4,698,592
[45] Date of Patent: Oct. 6, 1987

[54] MRI OF CHEMICAL SHIFT SPECTRA WITHIN LIMITED INNER VOLUME

[75] Inventor: David A. Feinberg, Berkeley, Calif.

[73] Assignee: The Regents of the University of California, Berkeley, Calif.

[21] Appl. No.: 766,401

[22] Filed: Aug. 16, 1985

[51] Int. Cl.$^4$ ............................................. G01R 33/20
[52] U.S. Cl. ..................................... 324/309; 324/306
[58] Field of Search ............... 324/300, 306, 307, 308, 324/309, 310, 312, 313, 314

[56] References Cited

U.S. PATENT DOCUMENTS

| | | | |
|---|---|---|---|
| 4,297,637 | 11/1981 | Crooks et al. | 324/309 |
| 4,318,043 | 3/1982 | Crooks et al. | 324/309 |
| 4,471,305 | 9/1984 | Crooks et al. | 324/309 |
| 4,506,223 | 3/1985 | Bottomley | 324/307 |
| 4,581,582 | 4/1986 | Redington | 324/309 |
| 4,585,993 | 4/1986 | Bottomley | 324/309 |
| 4,599,565 | 7/1986 | Hoenninger | 324/309 |

OTHER PUBLICATIONS

Kumar et al, J. Mag. Res 18, 69–83 (1975).
Brown et al "NMR Chemical Shift Imaging in Three Dimensions", Proc. Nat. Academy of Science, 79; 3523–3526, 1982.
Maudsley et al, "Spatially Resolved High Resolution Spectroscopy by 'Four Dimensional' NMR", J. Mag. Res 51, 147–152, 1983.
Pickett et al, "NMR In vivo Proton Chemical Shift Imaging", Radiology, 149: 197–201, 1983.
Bottomley et al "Localized P-31, C-13 and H NMR Spectroscopy of the Head and Body at 1.5 Telsa", Proc 2nd Annual Mtg. of Soc. of Mag. Res. In Med., pp. 53–54, 1983.
Maudsley et al, "Magnetic Field Measurement by NMR Imaging", J. Phys, E.: Sci. Mst., 17: 216–220, 1984.
Aue et al, "Volume-Selective Excitatron, A Novel Approach to Topical NMR", J. Mag. Res. 56, 350–354 (1984).

*Primary Examiner*—Michael J. Tokar
*Attorney, Agent, or Firm*—Nixon & Vanderhye

[57] ABSTRACT

Inner-volume MRI techniques are extended to provide chemical shift NMR spectra for each voxel of an imaged inner-volume of a larger object. Spatial resolution is achieved within a selected inner-volume using multiple phase-encoded NMR measurement cycles with 90° and 180° RF nutation pulses being applied in the presence of inner-volume selective $B_o$ magnetic gradients. However, NMR spin echo RF responses are recorded during readout periods without application of any magnetic gradients. The resulting NMR data is then subjected to one dimension of Fourier Transformation to resolve conventional NMR chemical shift spectra while additional dimensions of Fourier Transformation are used to provide desired spation resolution within the inner-volume. Thus, for spectroscopic imaging, the signal readout period is used for chemical shift information while the tissue volume is spatially resolved with phase encoding on two or three spatial axes which have reduced fields of view using three orthogonal selective RF irradiations.

8 Claims, 9 Drawing Figures

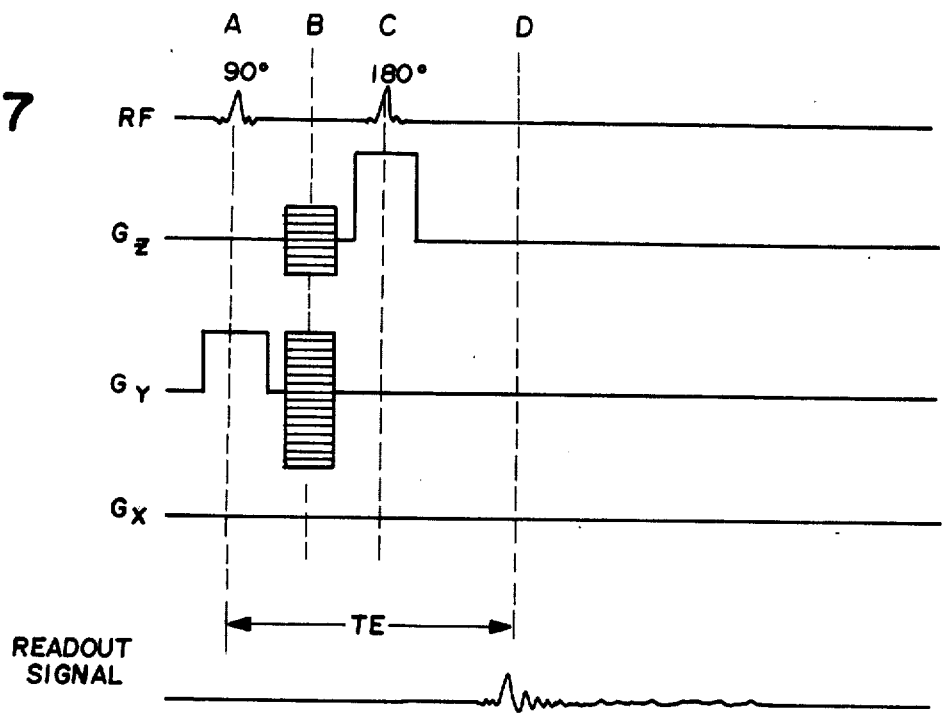
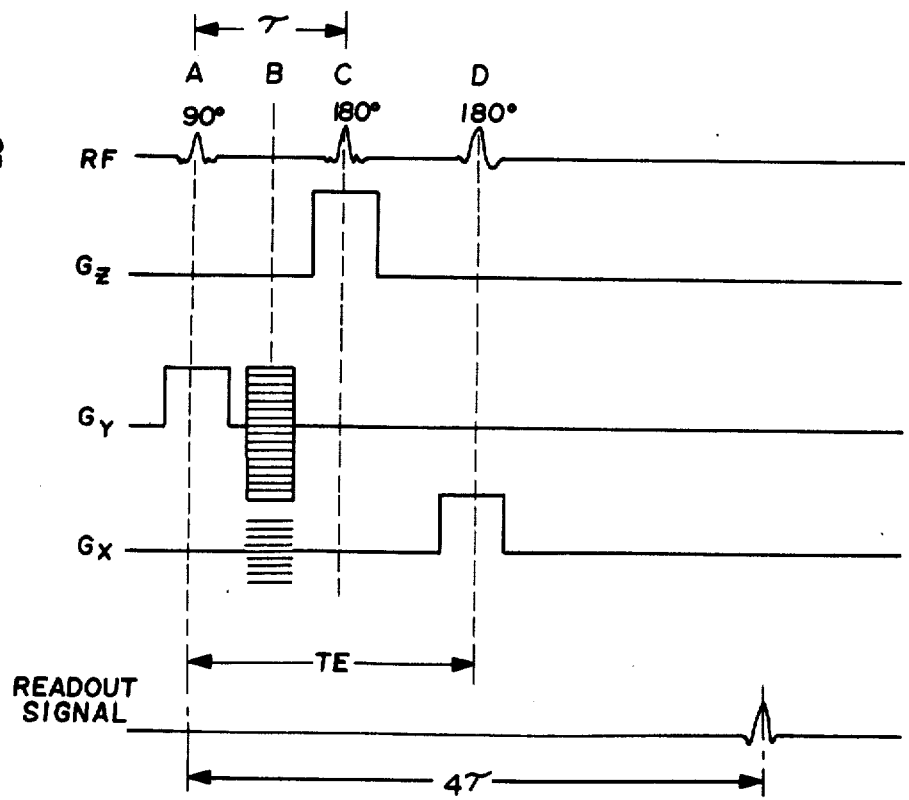

MRI OF CHEMICAL SHIFT SPECTRA WITHIN LIMITED INNER VOLUME

This invention relates to the field of magnetic resonance imaging (MRI) utilizing nuclear magnetic resonance (NMR) phenomena. It is particularly related to novel apparatus and method for acquisition of NMR image data from an innervolume of an object so as to include NMR chemical shift spectral data for each imaged voxel within the inner-volume. It uses an NMR imaging technique wherein slice-selective (albeit sometimes fairly wide "slices") NMR RF excitations including 90° and 180° nutation pulses are utilized to elicit NMR spin echo RF signal responses which are readout in the absence of any imposed magnetic gradient so as to therefore produce NMR chemical shift spectral data. It, in effect, combines inner-volume MRI techniques with prior NMR spectrascopic imaging procedures.

This application is related to earlier filed, commonly assigned, patents and applications of Crooks et al including U.S. Patent Nos. 4,297,637; 4,318,043; 4,471,305; and 4,599,565. The contents of these referenced related patents and/or patent applications is hereby incorporated by reference.

Magnetic resonance imaging (MRI) is now coming into widespread commercial usage. Nevertheless, there are still many possible areas of improvement. One such area for potential improvement relates to the provision of NMR spectroscopic imaging in the context of sub or inner-volume NMR imaging (i.e. an MRI technique used to reduce data acquisition time and/or to reduce aliasing in the resulting image).

Multiple section imaging as performed by Crooks et al (see the above-referenced related U.S. patents and see also Kumar, Welti, Earnst at J. Mag. Res. 18, 69–83, 1975) utilizes slice selective magnetic gradient pulses which are "on" during each radio frequency pulse (e.g. 90° nutation pulses and 180° nutation pulses) so as to achieve NMR at the Larmor frequency within a selected planar volume without substantially disturbing the spin lattice of adjacent planar volumes (each incident radio frequency pulse is typically modulated by a sinc function so as to select a substantially square edged planar volume in the spatial domain). After extracting the useful spin echo NMR RF response from a given planar volume, it is allowed to relax to its quiescent alignment with a static z-axis magnetic field while, in the meantime, other planar volumes are similarly selectively defined by suitable magnetic gradient pulses and sinc-modulated RF NMR pulses so as to produce the desired NMR spin echo responses from these other planar volumes. After a sequence of planar volumes have thus been irradiated and their respective NMR responses captured for subsequent analysis, the entire sequence is repeated many times with incrementally increased magnetic gradient pulses along an orthogonal y-axis so as to encode spatial information. Spatial information for the second x-axis dimension is typically encoded by imposing a constant magnetic gradient pulse along the x-axis during each spin echo NMR signal readout. The y-axis phase encoding is changed for each of M NMR cycles so as to provide a linearly increasing progression of y-axis phase encoding (the number of resulting image lines along the y-axis will be equal to the number M of phase encoding cycles of the sequence). A two-dimensional Fourier transformation process is then utilized to obtain the final NMR image (see above referenced U.S. patent 4,599,565).

This prior Crooks et al technique is depicted at FIG. 2 of the present application. As will be appreciated, for a given y-axis resolution of M lines per image, one must repeat the measurement cycle M times. A given measurement cycle can only be repeated after at least about one T1 interval (often on the order of one second or more). To help reduce the number of lines which must be resolved, an inner-volume MRI technique is being suggested (as described in more detail below) and as may also be apparent from the above-referenced related Crooks et al patents) so as to elicit NMR responses from only a selected sub or inner-volume.

It is also known that conventional NMR spectral data can be obtained for each voxel of 2-D or 3-D MRI in conventional whole body scanning. For example, see:

Brown, T.R.; Kincaid, B.M.; Uqurbil, K.; "NRM Chemical Shift Imaging in Three Dimensions", *Proc. Nat. Acad. Sci.* 79; 3523–3526, 1982;

Maudsley, A.A.; Hilal, S.K; Terman, W.H.; Simon, H.E.; "Spatially Resolved High Resolution Spectroscopy By 'Four Dimensional' NMR", *J. Mag. Res.* 51: 147–152, 1983;

Pikett, I.L.; Rosen, B.R.; "NMR: In vivo Proton Chemical Shift Imaging", *Radiology*, 149: 197–201, 1983;

Bottomley, P.A.; Smith, L.S.; Edelstein, W.A.; Hart, H.R.; Mueller, O.; Leue, W.N.; Darrow, R.; Reddington, R.W.; "Localized P-31, C-13 and H NMR Spectroscopy of The Head and Body at 1.5 Tesla", Proc. 2nd Annual Mtg. of *Soc. of Mag. Res. In Medicine*, 1983; and Maudsley, A.A.; Simon, H.E.; Hilal, S.K; "Magnetic Field Measurement by NMR Imaging", J. Phys. E.: Sci, Inst.,17:216–222, 1984.

In particular, it is known that if NMR RF responses are recorded in the presence of a homogenous magnetic field (i.e. just $B_o$, without any imposed gradients), then they will inherently include NMR chemical shift spectra which can be derived for each spatially resolved voxel using multi-dimensional Fourier Transformation techniques.

In "Volume-Selective Excitation. A Novel Approach to Topical NMR" (Aue, et al, J. Mag. Res. 56, 350–354 (1984)), a technique is proposed to measure the NMR chemical shift spectra at a selected "sensitive volume". A series of selective "three pulse sandwiches" (45°, 90°, 45° nutation pulses in presence of a slice selective magnetic gradient pulse) are used to leave only selected intersection volume with a negative $B_o$ magnetization. Thereafter a conventional non-selective broadband RF pulse is used to acquire chemical shift spectral data from the thus defined "sensitive volume".

I have discovered that one may more conveniently obtain NMR chemical shift spectral data for each voxel of an imaged inner-volume—simply (1) by adapting an MRI inner-volume data acquisition procedure (e.g. using selective 90°, 180° RF nutation pulses) so as to read out NMR spin echo responses without any imposed magnetic gradient, and (2) by including an extra dimension of spatial phase-encoding and Fourier transformation in the subsequent processing of such collected NMR spin echo data.

These as well as other objects and advantages of this invention will be more completely understood and appreciated by careful reading of the following detailed description of the presently preferred exemplary embodiments of this invention in conjunction with the accompanying drawings, in which.

Figure 3:
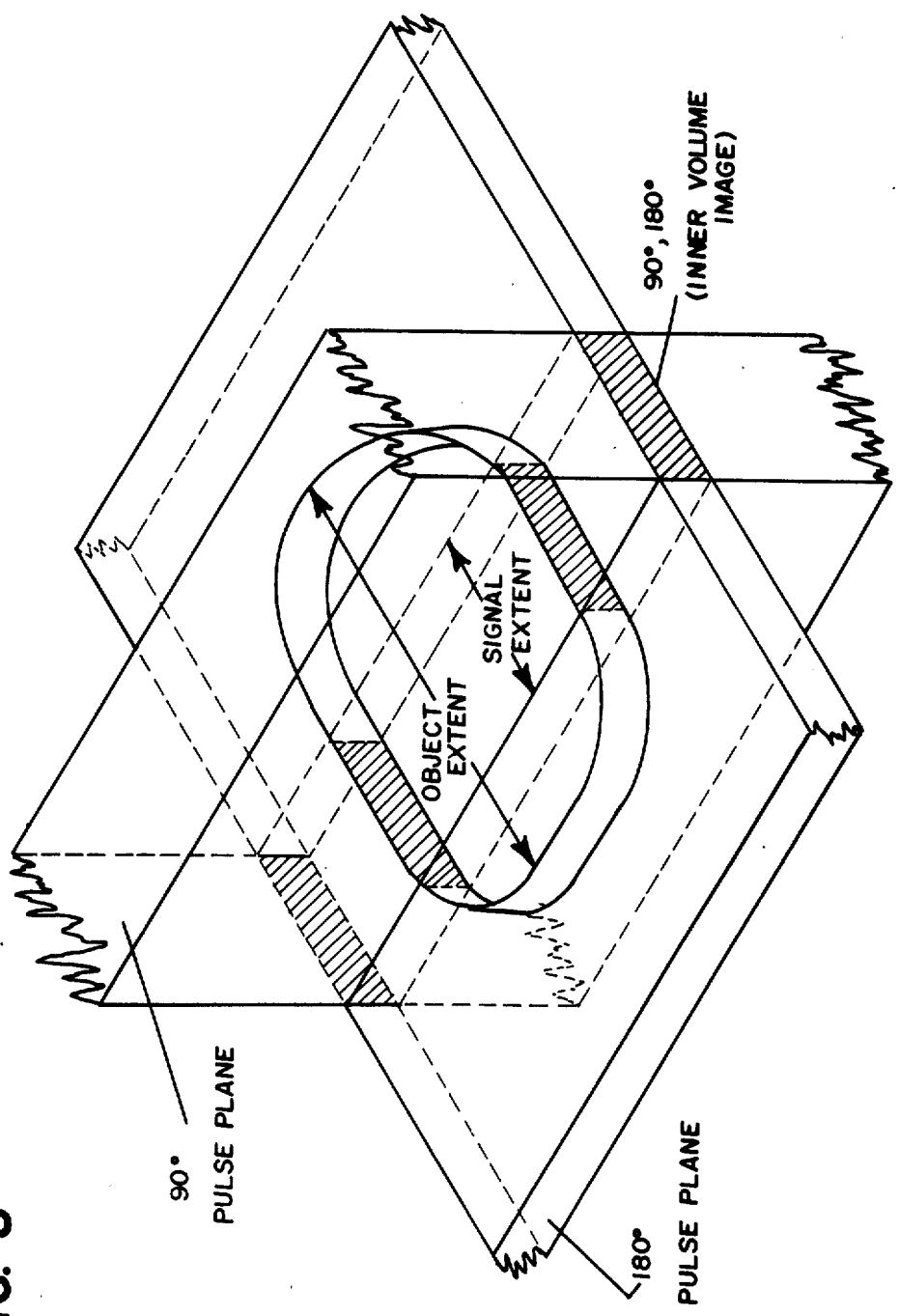
Figure 4:
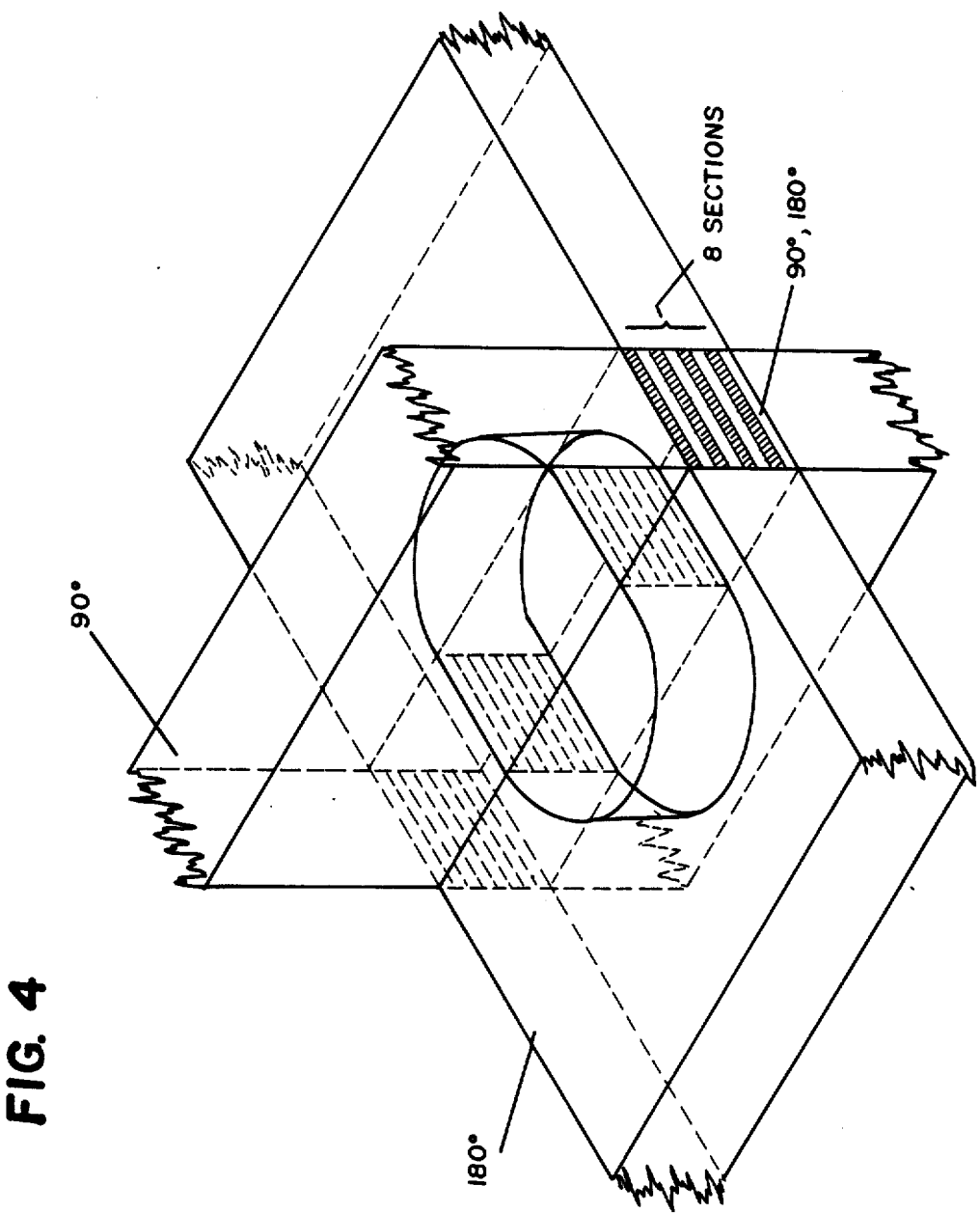
Figure 5:
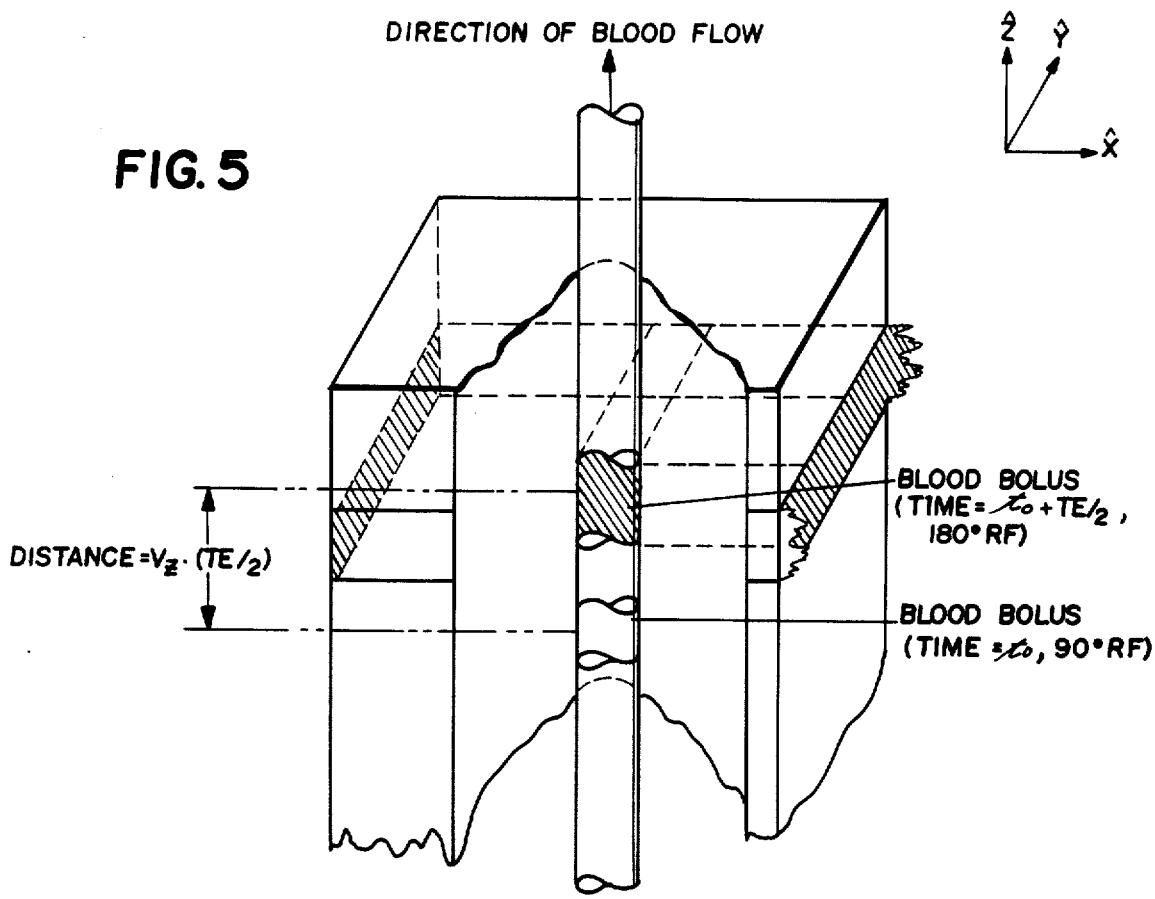
Figure 6:
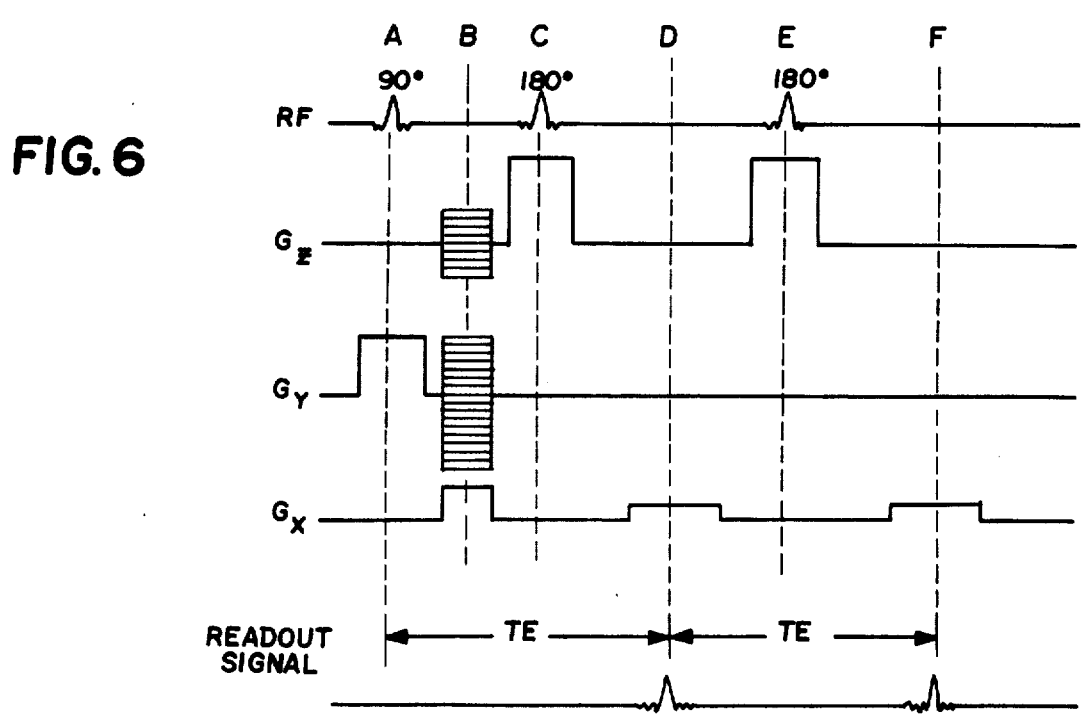

FIG. 3 is a perspective depiction of an inner-volume defined by the intersection of two selectively irradiated (90°, 180°) volumes of an object to be imaged (A 90° Rf pulse excites nuclei within a planar volume (broken or jagged lines indicate continued region), and the subsequent 180° RF pulse inverts the nuclei in a planar volume perpendicular to the first plane. Only those spin nuclei which experience both the 90° excitation pulse and the 180° inversion pulse are refocused to produce a spin echo signal. With the signal extent reduced to less than the object extent, a correspondingly narrower image field of view is permitted without superposition of outer regions onto the inner region of the image.);

FIG. 4 is a perspective depiction of repeated inner-volume data acquisition, cycles (To produce 3D inner volume images, the 180° RF pulse irradiates a thicker region of tissue. Independent phase encoding along the Z-axis permits resolution of the image sections within the thicker volume.);

FIG. 5 is a perspective depiction useful in explaining the response of moving blood during an inner-volume data acquisition procedure;

FIG. 6 is a schematic waveform diagram depicting an inner-volume 3-D data acquisition procedure (Pulsatile blood flow is directed along the Z-axis orthogonal to the image plane. The 90° RF pulse is on the long axis of the vessel and irradiates all the blood within the non-selective volume. The 180° pulse refocuses the blood bolus which was irradiated by the 90° pulse upstream and outside of the inner volume region.)

Figure 9:
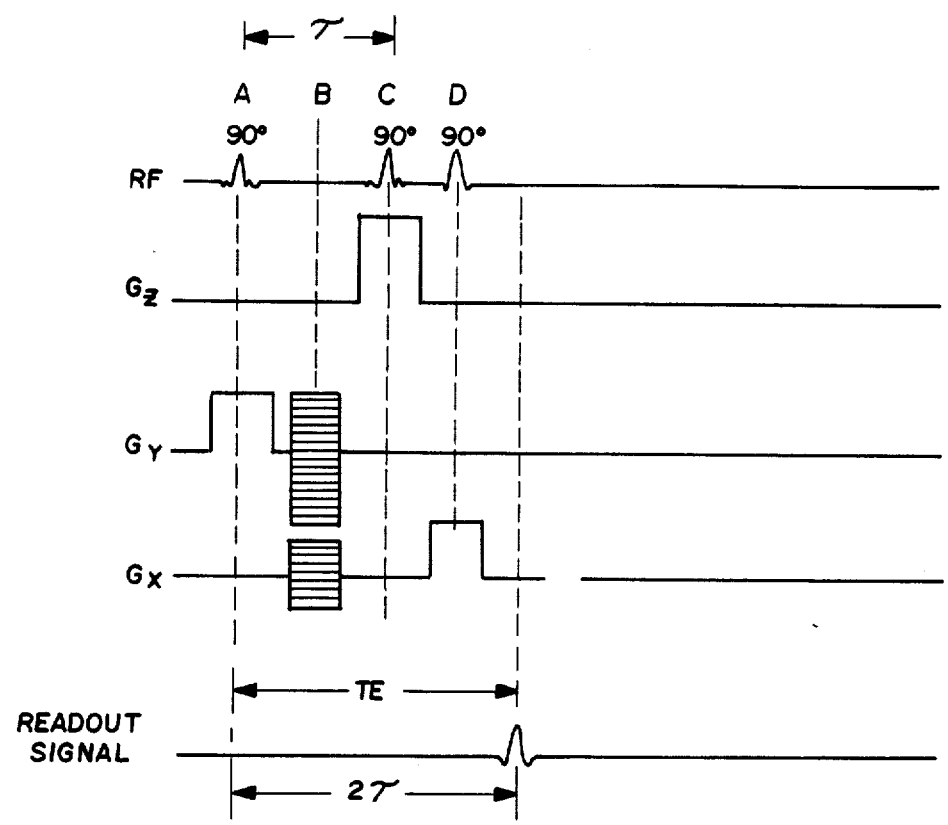

FIG. 7 is a schematic waveform diagram depicting a modification of the FIG. 6 innervolume MRI sequence so as to provide chemical shift spectra for voxels of the inner-volume, now resolved spatially by only two dimensions (y, z);

FIG. 8 is a schematic waveform diagram depicting a further modification of the FIG. 6 inner-volume sequence which may be used to effectively provide three dimensions of spatial resolution in addition to chemical shift spectra; and FIG. 9 depicts one possible alternate to the FIG. 8 procedure.

Figure 1:
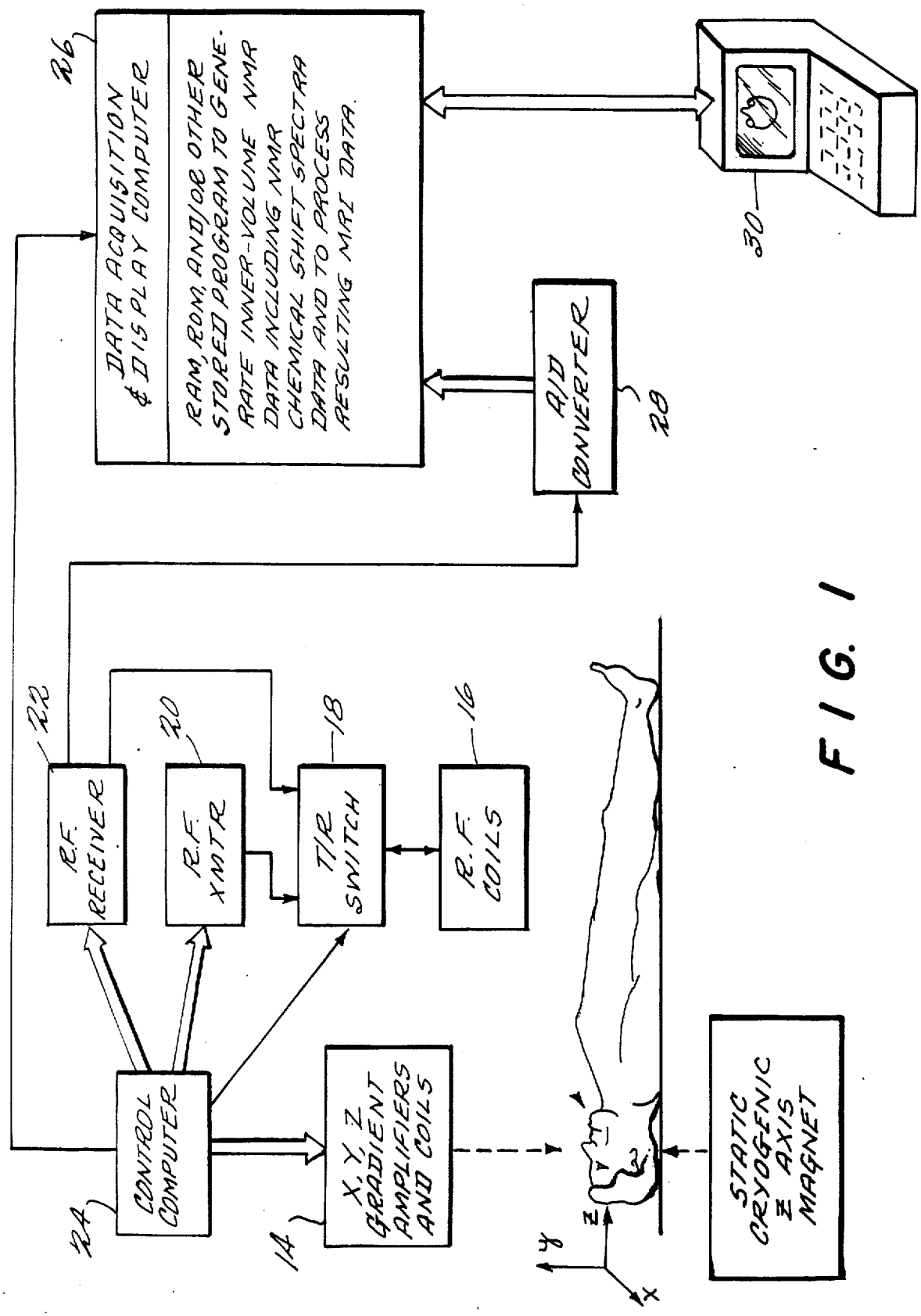
FIG. 1 is a block diagram of a typical MRI scanner system programmed so as to practice the novel data acquisition and processing procedures of this invention.

The novel data acquisition/processing procedure utilized by this invention can typically be achieved by suitable alteration of stored controlling computer programs in existing MRI apparatus. As an example of such typical apparatus, the block diagram of FIG. 1 depicts the general architecture of the Crooks et al system described in more detail in the above-reference related patents and/or patent applications of Crooks et al.

Typically, a human or animal subject (or other object) 10 is inserted along the z-axis of a static cryogenic magnet which establishes a substantially uniform magnetic field directed along the z-axis within the portion of the object of interest. Gradients may be imposed within this z-axis directed magnetic field along the x, y or z axes by a set of x, y, z gradient amplifiers and coils 14. NMR RF signals are transmitted into the body 10 and NMR RF responses are received from the body 10 via RF coils 16 connected by a conventional transmit/receive switch 18 to an RF transmitter 20 and RF receiver 22.

All of the prior mentioned elements may be controlled, for example, by a control computer 24 which communicates with a data acquisition and display computer 26. The latter computer 26 may also receives NMR RF responses via an analog to digital converter 28. A CRT display and keyboard unit 30 is typically also associated with the data acquisition and display computer 26.

As will be apparent to those in the art, such an arrangement may be utilized so as to generate desired sequences of magnetic gradient pulses and NMR RF pulses and to measure desired NMR RF responses in accordance with stored computer programs. As depicted in FIG. 1, the MRI system of this invention will typically include RAM, ROM and/or other stored program media adapted (in accordance with the following descriptions) so as to generate inner-volume data including NMR chemical shift data and to process the resulting MRI data.

Figure 2:
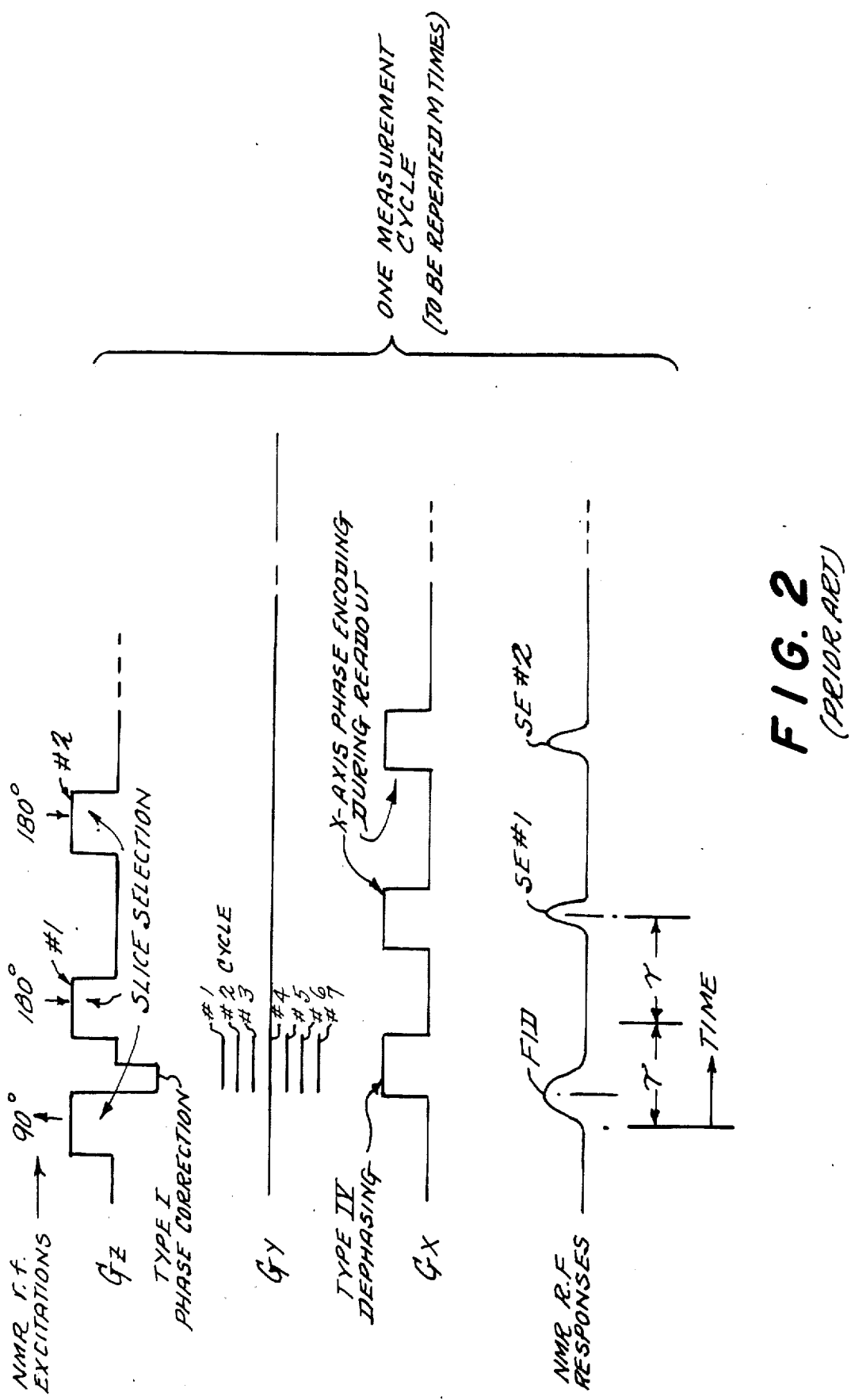
FIG. 2 is a schematic waveform diagram depicting a typical prior art Crooks et al data acquisition procesure.

FIG. 2 depicts a typical prior art Crooks et al data acquisition sequence. For example, each measurement cycle may be initiated by a 90° NMR RF excitation followed by a 180° NMR RF nutation pulse located $\tau$ later in time and, if desired for signal averaging purposes, followed by subsequent 180° RF nutation pulses (typically distributed at $2\tau$ time intervals). It will be noted that during each RF excitation pulse there is a slice selection $G_z$ magnetic gradient pulse switched "on" so as to selectively excite only the desired "slice" or "planar volume" (e.g. a slice of given relatively small thickness through the object being imaged). During each resulting spin echo NMR RF response, x-axis phase encoding is achieved by applying an x-axis magnetic gradient during the readout procedure (typically each spin echo pulse is sampled every 30 microseconds or so with a digitized value being stored for later processing).

In addition, a cylce-dependent y-axis phase encoding pulse is employed typically having a different magnitude on each measurement cycle. Although only seven measurement cycles are explicitly depicted in FIG. 2, it will be understood that in practice the number of measurement cycles must be equal to the number of desired lines of resolution along the y-axis in the final image. Furthermore, although a generalized case of plural spin echoes in a given measurement cycle is depicted at FIG. 2, since each spin echo signal has common y-axis phase encoding, typically only one or two spin echoes are actually utilized and practiced before that particular measurement cycle is terminated and the corresponding "slice" is allowed to "relax" for a T1 interval or more while other "slices" are similarly addressed so as to obtain their spin echo responses. Typically on the order of hundreds of such measurement cycles are utilized (e.g. so as to obtain enough data to provide hundred of lines of resolution along the y-axis).

As may be better understood by reading the above referenced related patents/patent application, a sequence of M such y-axis phase encoded spin echo signals may be subjected to a two-dimensional Fourier transformation process so as to result in M x M pixel values for a resulting NMR image.

As an introduction to the present invention, a preferred form of inner-volume imaging will first be discussed. Although cross-sectional MRI examination of the whole head and whole body is useful for screening large regions of tissue, imaging sub-sectional regions of the head and body can also be advantageous. Orthogonally directed selectively irradiated planes having different RF nutation or flip angles produce a spatially limited signal region from which 2D or 3D volume images are reconstructed. As a result, images with limited field of view can be acquired in greatly reduced imaging time. These sub-sectional or 'inner volume' images may also eliminate respirator motion artifacts by excluding moving tissues from the imaged volume. One result of this technique is a high signal from rapid pulsatile blood flow, produced without cardiac gating of the pulse sequence. This positive image contrast in major arteries may potentially be used for clinical diagnostic procedures.

In magnetic resonance Fourier imaging, the size of the phase encoded dimensions from which NMR signal is produced must be less than the image field of view, otherwise signal located outside the field of view is aliased into lower frequencies. When the object is too large, the lower frequencies fold over onto existing object frequencies and two regions of tissue become superimposed. In whole body MRI, this problem is avoided either by reducing the spatial resolution or by increasing the number of image lines to extend the field of view beyond the boundaries of the body. Alternatively, if the extent of the signal volume could be spatially limited to a smaller region of the body, the field of view can be reduced so as to avoid the problem of aliasing. (Surface coils may be used to reduce the extent of the signal volume of localizing the radio frequency sensitivity near to the surface of the body, however, inner regions of the body will provide only weak signals.)

The preferred magnetic resonance imaging method selectively images inner regions of the body without imaging adjacent surrounding tissue otherwise present in the body cross-section. The imaging time can be reduced proportionate to the reduced field of view. In one application, inner volume MRI could be used to exclude from images the moving regions of the body which produce severe artifacts in regions of interest. For example, in MR body images, artifacts caused by the respiratory motion of the abdominal wall may be reduced. In a different application, inner volume images can be used to assess flow in blood vessels deep within the body when it is not necessary to image adjacent static tissue.

Similar to earlier NMR selective line scan imaging techniques (e.g. see Garroway, et al "Image Formation in NMR by a Selective Irradiation Process", J. Phys. C. 7: L457, 1974 and, see also, Crooks, "Selective Irradiation Line Scan Techniques for NMR Imaging", IEEE Trans. on Nuc. Science, Vol. NS-27:1239, 1980), inner volume imaging utilizes two or more spatially selective RF pulses to excite and invert nuclei in two perpendicular volumes, as shown in FIG. 3. The intersecting volume of tissue first has its spins nutated by a 90° RF mutation or flip angle and then by 180° to produce a spin echo signal emanating only from the intersection region or inner-volume for image reconstruction. The imaged inner-volume can be positioned anywhere within the body electronically.

The imaging time required to define an inner volume is directly proportional to the number of image lines times the number of image slices as shown in Table 1:

TABLE I

| Physical Dimensions | Imaging Time | Relative Signal/Noise |
|---|---|---|
| 1D Spatial | nTR | $\sqrt{n}/V$ |
| 2D Spatial | PnTR | $\sqrt{nP}/V$ |
| 3D Spatial | PnSTR | $\sqrt{nPS}/V$ |
| 2D (Multi-slice) | PnTR | $\sqrt{nP}/V$ |

Table I gives the data acquisition time and signal-to-noise (S/N) ratio for a general innervolume pulse sequence: (TR) repetition time of pulse sequence, (P) the number of phase encoded cycles of the sequence, (n) the number of redundant signals used for averaging, (V) the image element volume or volxel dimension and (S) the number of image sections or slices.

The time otherwise required to image an entire body cross section at coarse spatial resolution can, instead, be spent on defining a narrower region with higher spatial resolution since the problem of aliasing is eliminated by this technique. The imaging time saved by reducing the field of view on one spatial axis can also be spent on defining multiple image sections, encoding blood flow, chemical shift spectra (as claimed herein), or other physical parameters in the region of interest.

Experiments were conducted on a prototype Diasonics MT/S whole body imaging system which included a superconductive magnet operating at .35 Tesla equipped with three orthogonal sets of gradient coils. The patient lies on a bed having variable positions parallel to the direction of the static magnetic field, defined as the Z-axis. The vertical direction and horizontal direction are defined as the Y-axis and X-axis respectively. Synchronization of the pulse sequence to the subject's cardiac cycle was made possible with a battery powered electrocardiogram monitor having three leads connected to the person's chest. A fiber optic cable transferred the EKG signal out of the magnet and RF screen room enclosure. The transduced signal was connected to the system's control computer with an intermediate trigger delay used by the operator to set a temporal delay between the EKG R-wave and the beginning of each pulse sequence cycle.

Inner-volume images were positioned onto target regions by displacement of one of the two RF pulse planes shown in FIG. 3. Initially, the pulse sequence was calibrated to determine the spatial displacement on each axis per frequency offset (cm/Hz). The resulting scale factors were used in all the experiments to position the innervolume images onto regions of interest. For 3D volume imaging, a 2D inner volume image of the body or head was acquired first to fine the coordinates of the arteries or target structures with respect to the center of the image. The coordinates were converted to frequency offsets for positioning the 3D inner-volume image.

To produce 2D images, multiple cycles of the pulse sequence encoded the phase of the signal to spatially resolve information along one axis (see below). A signal readout gradient applied on a second perpendicular axis gave the second dimension of in-plane spatial resolution. To produce a 3D image, the above multi-cycle sequence is repeated in its entirety with additional phase encoding along the third axis orthogonal to the image plane, FIG. 4, as many times as there are sections (see Kumar, et al, supra; Johnson et al, "Improvements in Performance Time for Simultaneous Three-Dimensional NMR Imaging", *J. Mag. Res.* 54: 374–384, 1983; Crooks et al, "Thin Section Definition of Magnetic Resource Imaging: Technical concepts and Their Implementation", Rad. 1985, 154:463–467.) In these experiments eight sections were defined. For both the 2D images and 3D images, the in-plane spatial resolution was 1.7 mm by 1.7 mm. The section thickness of the 2D images are 7 mm, and the 3D image sections ar 5 mm thick.

Three 2D inner volume images of the brain were acquired with 64, 32 and 16 lines. The three images were compared with aliased images and found to have the same resolution, slice thickness and number of signal averages (n=4), and were acquired with a TR =0.25 seconds. The respective imaging times were 2,1 and .5 minutes as compared to 4 minutes for a full cross section for fields of view of 25.6 cm, 12.8 cm, 6.4 cm and 3.2 cm. The respective signal-to-noise ratios (S/N) measured in white matter were 47.4, 35.2, 26.1 and 16.7 showing improvement with the square root of imaging time, consistent with the predicted relative S/N in Table I. The higher value of S/N of the full volume can be obtained with 3D inner volume imaging if the imaging time is held constant and the number of sections is increased by the same factor which is used to decrease the number of lines. (Data acquisition time=number lines×number of sections ×TR×number of signals averaged.)

Sagittal images of a person's thoracic spine were made with cross-sectional 2D spin echo imaging and with 2D inner-volume imaging. The abdominal chest wall, undergoing normal breathing motion, produced noticable cresent shaped artifacts in the cross-sectional image with full field of view. No artifacts were noticable in the inner-volume image. Transverse images of the abdomen showed similar elimination of breathing artifact.

Transaxial 3D inner volume images of a human heart were acquired with 64 lines and a sections. The imaging time per section was half that required to similarly image the entire cross-section of the body requiring 128 lines. The image volume was intentionally positioned inside the thoracic cavity to exclude the breathing motion dependent signal of subcutaneous fat from images. Respiratory gating is sometimes used to eliminate these artifacts even though it extends imaging time (see Schultz et al, "Effect of Motion on Two Dimensional Fourier Transformation Magnetic Resonance Images", Rad. 152; 117–121, 1984).

To visualize blood flow in the cranial vessels, 3D volume images were made with 8 sections and 32 lines, TR=25 seconds, n=4, and image acquisition time of 4 minutes. Relatively high signal magnitude compared to surrounding static tissue was observed in the internal carotid arteries in both the first and second echo images as well as in the vertebral arteries and jugular veins. These images of rapidly flowing pulsatile blood were made without synchronizing the pulse sequence to the cardiac cycle (cardiac gating).

When imaging the spine and other organs where artifacts are caused by breathing motion, gating a pulse sequence to the respiratory cycle is effective in reducing motion artifacts (see Schultz, et al, supra). With respiratory gating, however, intrinsic variation in TR would occur if data is taken immediately after each restart and gating necessitates longer imaging time due to the delays during which data is not acquired. The cross-sectional image of the spine which included chest wall showed a much higher level of vertical band artifacts than observed in the inner volume image. This artifact can largely be attributed to the motion of fat which has high signal magnitude and which changes position during respiratory expansion of the chest. The fat's position is not the same in each cycle of the pulse sequence, and therefore produces deviations from the otherwise linearly increasing phase encoding process.

With the 2D multislice MRI, high velocity blood produces very low signal due to the effect of magnetic gradients on the phase of moving nuclei, and because blood flows out of the slice during the process of spin echo creation (see Feignberg et al, "Pulsatile Blood Velocity in Human Arteries Display by Magnetic Resonance Imaging", Rad. 1984; 153: 177–180). The visualization of unusually high signal from rapidly flowing blood can be understood with respect to the above two factors. Regardless of the upstream blood's velocity on the z-axis or position in the excited volume, the 180° pulse always refocuses some of the blood to produce a spin echo signal. As shown diagrameticaly in FIG. 5, the blood centered on position $A=V_z/(TE/2)$ upstream from the 180° RF plane is refocused to produce a spin echo signal. In these non-gated studies, even though blood flowing at low velocity and high velocity experiences the 90° pulse at different positions upstream, both can produce spin echo signal. In general, the combined effect of the pulse sequence TR, heart rate, pulsatile changes in velocity and image volume dimensions directly affect the signal magnitude from blood in each cycle of the pulse sequence.

An additional factor to be considered in understanding the blood's signal is that nuclei moving in the direction of a magnetic gradient undergo a change in phase proportional to their velocity. If a distribution of velocities exist within a voxel, then an incoherent signal results with reduced magnitude. In the 3D inner volume images, the 90° selective excitation uses a gradient applied perpendicular to the direction of flow and consequently the net phase of the flowing nuclei is unaffected by the gradient. It is possible to develop different permutations of the inner volume pulse sequence by applying the volume selective gradient pulses on different axis. For example, swapping slice selective Y and Z gradients in FIG. 3 would produce a completely different signal dependence on flow.

The imaging sequence shown in FIG. 6 produces two spin echo images with transaxial orientation. The sequence of events (A)–(F) is described as follows: at (A) sinc modulated 90° nutation RF pulse occurs simultaneously with a $G_y$ gradient pulse to produce the spatially selective excitation of nuclear spins; at (B) three gradient pulses are applied, $G_y$ phase encodes in-plane resolution (and also simultaneously rephases the magnetization which was spread by the prior 90° nutation pulse), $G_z$ phase encodes image slices, and $G_x$ defocuses the FID in order to temporarily center the later occurring spin echo signal; at (C), a sinc modulated 180° RF pulse occurs simultaneously with a $G_z$ gradient pulse to produce echo refocusing; at (D), a readout gradient $G_x$ frequency encodes the spin echo signal for resolution along an in-plane axis; and at (E), a second spatially selective refocusing of signal produces a second spin echo signal at readout time (F). To produce sagittal images, all the gradient pulses $G_z$ and $G_x$ are interchanged.

2D images may be made by iteration of the pulse sequence in FIG. 6, each time with a different magnitude of $G_y$ at time (B). To produce 3D images, the entire above process is repeated as many times as there are sections, with different $G_z$ linear phase encoding gradient strengths at times (B).

Each of the above described cycles of the FIG. 6 pulse sequence can be repeated n times for signal averaging and to cancel FID artifacts. These artifacts are produced by FID signal active during the spin echo (SE) but generated by the 90° irradiation of the planar region outside the innervolume. Such artifacts can be cancelled with (n=2) by changing the phase of the 180° irradiation so that the FID and SE have the same sign in one of the data acquisitions and opposite signs in the other acquisition. The averaging is performed by subtracting the two data sets so that the SE's add but the FIDs cancel. An FID can also be generated by regions outside the inner-volume exposed to the 180° irradiation where the nutation angle is not precisely 180° i.e. due to RF inhomogeniety or the irradiation's profile). Two more averages, where the phase of the 90° irradiation is changed to make the sign of this FID oposite that of the SE, will allow cancellation of this artifact. Thus, four average imaging eliminates these FID artifacts and improves S/N by a factor of two.

An extension of the FIG. 6 inner-volume imaging sequence maybe made to provide NMR spectral innervolume imaging by removing the readout gradient during period D as shown in FIG. 7—and by accumulating the NMR spin echo signal for a longer time (to provide a higher frequency resolution $\Delta f$ where $\Delta f \alpha 1/\Delta t$) and $\Delta t$ is the sampling interval. The procedure of FIG. 7 encodes a three-dimensional volume within two spatial dimensions (i.e. by virtue of the $G_z$ and $G_y$ phase encoding gradients used during period B). Note that since there is now no spatial resolution along the x-axis, each spatially resolved voxel is actually a columnar volume of y,z dimensions as determined by the phase encoding increments of $G_y$, $G_z$. Thus, for each such columnar volume, an independent NMR spectrum is produced after suitable three-dimensional Fourier Transformation (i.e., two FT dimensions for spatial resolution along y,z axes and another FT dimension for resolving NMR chemical shift spectra).

FIG. 8 adds another 180° pulse and another axis of controlled magnetic gradients to the procedure of FIG. 7 so as to retain a full three dimensions of spatial resolution—while yet still providing the desired chemical shift spectra for each voxel. Here three selective RF excitations are utilized at periods (A), (C) and (D)— each on a different axis. The strong selective $G_z$ gradient reduces the signal-generating volume to a relatively thin essentially planar volume. Different phase encoding on $G_y$ and $G_x$ at period (B) in multiple repititous of the measurement cycle, produces x,y spatial resolution within the planar volume selected by $G_z$. The fixed ampitude selective $G_x$, $G_y$ gradients (used during RF excitatious at A and D) limit the signal producing region to a sub-volume of the entire object, thus permitting few phase encoding cycles to be used for a given spatial resolution. That is, the inner-volume MRI techniques, reduce the signal volume to equal that of a small field of view which, in turn, can be resolved with fewer cycles of phase encoding.

FIG. 9 depicts a modified revision of the FIG. 8 procedure. Here, two successive 90° RF nutation pulses are utilized to make the first NMR spin echo (TE=$2\tau$) usable (rather than the second at TE=$4\tau$) for capturing NMR chemical shift spectra. Here, the fixed innervolume selective $G_x$, $G_y$, $G_z$ gradients and the changing $G_x$, $G_y$ phase encoding gradients are used just as in FIG. 8. However, the second and third RF nutation pulses in FIG. 9 are two adjacent 90° pulses rather than 180° pulses. As will be appreciated, the net cummulative effect of two 90° pulses will be similar to that of a single 180° pulse. In the FIG. 8 embodiment, the first spin echo at TE=$2\tau$ is not usable for NMR spectra because it occurs during a magnetic gradient pulse. However, using the FIG. 9 approach, the first spin echo is usable and one may therefore save valuable data acquisition time.

Unfortunately, the procedure of FIG. 9 can be expected to increase FID artifact and it requires more rapid gradient switching techniques—to position the second and third 90° nutation pulses (and their associated gradients) closely in time. Therefore, the procedure of FIG. 7 (2D) or 8 (3D) is, at this time, still preferred.

In one exemplary embodiment, the time domain spin echo signals SE are first Fourier transformed with respect to the real time variable. Thereafter, the resulting 1DFT data is further transformed on a first pseudo-time variable (e.g. corresponding to phase-encoding along the x-axis dimension) and, thereafter, the resulting 2DFT data is further transformed on a second pseudo-time variable (e.g. corresponding to phase-encoding along the y-axis dimension). Since the inner-volume is already limited to a planar volume in the third spatial dimension (e.g. the z-axis), the result is an NMR chemical shift spectrum signal for each x,y,z voxel. If t=the real time variable, t'=the pseudo-time variable associated with cyclic variation of $G_x$ on successive measurement cycles, t''=the pseudo-time variable associated with cyclic variation of $G_y$ on successive measurement cycles, and f=the chemical shift spectral frequency variable, then the processing of the captured raw NMR spin echo data SE(t,t',t'') for a given z-axis value may be flow charted as follows: SE(t,t',t'')→[1DFT]$_t$-→SE(f,t',t'')→[1DFT]$_{t'}$→SE(f,x,t'')→[1DFT]$_{t''}$-→SE(f,x,y). The creation of a corresponding suitable controlled computer program for the apparatus of FIG. 1 is believed to be well within the capability of those skilled in this art in view of the foregoing disclosure. (It will, of course, be recognized that if the raw data sample points are appropriately re-organized, the Fourier Transformation of the t,t',t'' variables may be carried out in other orders.)

Assuming a perfectly homogeneous magnetic field (in the absence of applied $G_x$, $G_y$ or $G_z$ gradients), the resulting chemical shift spectra for each voxel should be aligned on a common frequency scale so that chemical shift spectral images can be readily produced. For example, one might display, as a visual image, appropriately arrayed pixel values proportional to the strength (i.e. magnitude of the $H_2O$ or other desired molecular spectral "line" for each x,y voxel spectrum in a selected z plane. If significant inhomogeneties are present in the quiescient magnetic field, then the position of a known spectral line in each voxel spectrum can be identified, the spectrum in each voxel then being translated to a common frequency scale before a visual image of a desired spectral value is generated and displayed, as should now be apparent.

Although only a few exemplary embodiments of this invention have been described in detail, those skilled in the art will recognize that many variations and modifications may be made in such examples while yet retaining many of the novel features and advantageous of this invention. Accordingly, all such variations and modifications are intended to be included in the scope of the appended claims.

What is claimed is:

1. A method for obtaining NMR chemical-shift spectral images of an inner-volume of an object, said method comprising the steps of:
    (a) eliciting an NMR spin echo response from said inner-volume by imposing multiple RF nutation pulses, each in the presence of selective fixed magnitude magnetic gradients effectively limiting NMR excitations so as to nutate nuclei only in respective subvolumes of the object, which subvolumes intersect and define said inner-volume by their intersection, such that said spin echo response emanates only from said inner-volume;
    (b) during successive repetitions of step (a), imposing predetermined different degrees of phase-encoding magnetic gradients directed along at least two different spatial dimensions and at times when said selective gradients are turned off;
    (c) recording digital data representing said spin echo responses which occur in the absence of any imposed magnetic gradient; and
    (d) performing an at least three-dimensional Fourier transformation by digital data processing of the recorded spin echo responses to provide digital data representing an NMR chemical shift spectrum for each of a plurality of arrayed contiguous image volume elements of said inner-volume of the object.

2. A method as in claim 1 wherein:
    each repetition of step (a) comprises imposing a 90° nutation pulse during a $G_y$ magnetic gradient pulse followed $\tau$ later by a 180° nutation pulse during a $G_z$ magnetic gradient pulse and said spin echo response occurs $2\tau$ after said 90° nutation pulse with respective predetermined degrees of phase-encoding $G_z$ and $G_y$ magnetic gradient pulses occurring between said 90° nutation pulse and said spin echo response.

3. A method as in claim 1 wherein:
    each repetition of step (a) comprises imposing a 90° nutation pulse during a $G_y$ magnetic gradient pulse followed $\tau$ later by a 180° nutation pulse during a $G_z$ magnetic pulse followed another $\tau$ later by a further 180° nutation pulse during a $G_x$ magnetic gradient pulse and said spin echo response occurs $4\tau$ after said 90° nutation pulse and with respective predetermined degrees of phase-encoding $G_y$ and $G_x$ magnetic gradient pulses occurring between said 90° nutation pulse and said spin echo response.

4. A method as in claim 1 wherein:
    each repetition of step (a) comprises imposing a first 90° nutation pulse during a $G_y$ magnetic gradient pulse followed $\tau$ later by a second 90° nutation pulse during a Gz magnetic gradient pulse followed by a third 90° nutation pulse during a $G_x$ magnetic gradient pulse and said spin echo response occurs approximately $2\tau$ after said first 90° nutation pulse with respective predetermined degrees of phase-encoding $G_y$ and $G_x$ magnetic gradient pulses occurring between said first 90° nutation pulse and said spin echo response.

5. Apparatus for obtaining NMR chemical-shift spectral images of an inner-volume of an object, said apparatus comprising:
    means for eliciting an NMR spin echo response from said inner-volume by imposing multiple RF nutation pulses, each in the presence of selective fixed magnitude magnetic gradients effectively limiting NMR excitations so as to nutate nuclei only in respective subvolumes of the object, which subvolumes intersect and define said inner-volume by their intersection, such that said spin echo response emanates only from said inner-volume;
    said means for eliciting including means for imposing predetermined different degrees of phase-encoding magnetic gradients directed along at least two different spatial dimensions while eliciting each spin echo response and at times when said selective gradients are turned off;
    means for recording digital data representing said spin echo responses which occur in the absence of any imposed magnetic gradient; and
    means for performing an at least three-dimensional Fourier transformation by digital data processing of the recorded spin echo responses to provide digital data representing an NMR chemical shift spectrum for each of a plurality of arrayed contiguous image volume elements of said inner-volume of the object.

6. Apparatus as in claim 5 wherein:
    said means for eliciting imposing a 90° nutation pulse during a $G_y$ magnetic gradient pulse followed $\tau$ later by a 180° nutation pulse during a $G_z$ magnetic gradient pulse and said spin echo response occurs $2\tau$ after said 90° nutation pulse with respective predetermined degrees of phase-encoding $G_z$ and $G_y$ magnetic gradient pulses occurring between said 90° mutation pulse and said spin echo response.

7. Apparatus as in claim 5 wherein:
    said means for eliciting imposes a 90° nutation pulse during a $G_y$ magnetic gradient pulse followed $\tau$ later by a 180° nutation pulse during a $G_z$ magnetic pulse followed another $\tau$ later by a further 180° nutation pulse during a $G_x$ magnetic gradient pulse and said spin echo response occurs $4\tau$ after said 90° nutation pulse and with respective predetermined degrees of phase-encoding $G_y$ and $G_x$ magnetic gradient pulses occurring between said 90° nutation pulse and said spin echo response.

8. Apparatus as in claim 5 wherein:
    said means for eliciting imposes a first 90° nutation pulse during a $G_y$ magnetic gradient pulse followed $\tau$ later by a second 90° nutation pulse during a $G_z$ magnetic gradient pulse followed by a third 90° nutation pulse during a $G_x$ magnetic gradient pulse and said spin echo response occurs approximately $2\tau$ after said first 90° nutation pulse with respective predetermined degrees of phase-encoding $G_y$ and $G_x$ magnetic gradient pulses occurring between said first 90° nutation pulse and said spin echo response.

* * * * *

UNITED STATES PATENT AND TRADEMARK OFFICE
CERTIFICATE OF CORRECTION

PATENT NO. : 4,698,592

DATED : October 6, 1987

INVENTOR(S) : David A. Feinberg

It is certified that error appears in the above-identified patent and that said Letters Patent is hereby corrected as shown below:

Column 2, line 49, after "in", insert --the--;

line 50, after "only", insert --a--;

Column 4, line 6, change "receives" to --receive--;

line 57, change "hundred" to --hundreds--.

Column 11, line 53, after "another", insert --2--.

Column 12, line 35, change "imposing" to --imposes--;

line 47, after "another", insert --2--.

Signed and Sealed this

Twenty-eighth Day of June, 1988

Attest:

DONALD J. QUIGG

*Attesting Officer*    *Commissioner of Patents and Trademarks*